United States Patent [19]

Green

[11] 4,400,443
[45] Aug. 23, 1983

[54] LAMINATED ENCODER DISC

[75] Inventor: Jeffrey W. Green, Hutchinson, Minn.

[73] Assignee: Hutchinson Technology Incorporated, Hutchinson, Minn.

[21] Appl. No.: 178,929

[22] Filed: Aug. 18, 1980

[51] Int. Cl.³ ............................................. B22F 00/00
[52] U.S. Cl. ............................. 428/571; 250/231 SE; 250/237 G; 340/347 P; 428/596; 428/597
[58] Field of Search ................. 250/231 SE, 237 G; 340/347 P; 428/571, 596, 597

[56] References Cited

U.S. PATENT DOCUMENTS

| | | | |
|---|---|---|---|
| 2,901,170 | 8/1959 | Poole | 235/92 |
| 3,058,001 | 10/1962 | Dertouzos | 250/231 SE |
| 3,193,744 | 7/1965 | Seward | 250/231 SE |
| 3,205,364 | 9/1965 | Pong | 250/231 SE |
| 3,399,347 | 8/1968 | Martens | 324/96 |
| 3,714,448 | 1/1973 | Cronan | 250/231 |
| 3,731,373 | 5/1973 | Johnson | 250/231 SE |
| 3,906,223 | 9/1975 | White | 250/231 |
| 3,935,447 | 1/1976 | Black et al. | 250/231 SE |
| 3,965,349 | 6/1976 | Jespersen | 250/231 SE |
| 3,983,391 | 9/1976 | Clemons | 250/237 |
| 4,086,488 | 4/1978 | Hill | 250/231 |
| 4,113,381 | 9/1978 | Epstein | 356/5 |
| 4,182,953 | 1/1980 | Hurley, et al. | 250/231 |
| 4,197,359 | 4/1980 | Rager et al. | 428/596 |
| 4,199,749 | 4/1980 | Richter | 250/231 SE |
| 4,207,463 | 6/1980 | Iyeta | 250/231 |

*Primary Examiner*—Mark Bell
*Attorney, Agent, or Firm*—Everett J. Schroeder; Kenneth D. Siegfried; Robert O. Vidas

[57] ABSTRACT

An encoder disc comprised of two or more stainless steel laminations, at least one of which is thinner than the others for the purpose of providing more accurately sized openings in the disc.

24 Claims, 2 Drawing Figures

LAMINATED ENCODER DISC

DESCRIPTION

Background of Prior Art

This invention relates to encoder discs which are used as angular positioning devices and for measuring angular velocity. Typically they are mounted on a rotatable shaft, as at the end of a DC servo motor, and operate in conjunction with a light source, a light sensing device and an electronic control circuit to measure angular rotary movement of the shaft. As the disc rotates on the shaft between the light source and the light sensitive device, light from the source is transmitted through a series of windows or an opening of predetermined pattern i.e., a code track, in the disc. The resulting pulses of light are counted by the light sensitive device and control circuit to measure the rotation of the shaft on which the disc is mounted. The windows in the disc may take various forms, in part depending on the type of material from which the disc is made. The purpose of the windows is to provide a code track. Such code tracks may consist of reflectivity areas as well as the transmissivity areas described hereinabove. This invention is applicable to both types in its most general aspects regardless of the particular code track means utilized.

Historically, encoder discs have been made of two primary types: continuous substrate and perforated.

Continuous substrate discs have been made of transparent or reflective materials such as glass, plastic, film and quartz. The necessary code track pattern has been generated photographically in an emulsion coating or by photoetching in a metallic coating such as chromium.

Perforated discs have been made by etching, machining, or stamping windows or other desired openings of various patterns into an opaque disc such as metal or plastic. An additional, but less commonly used disc has been made by electroplating a pattern on a metallic disc and then etching through the disc with a chemical that does not attack the electroplated pattern.

The continuous substrate discs have deficiencies which make them less satisfactory than the improved disc described herein. An obvious deficiency is the likelihood of breaking a glass substrate or scratching coated areas, thereby destroying the integrity of the code track pattern. Less obvious is the difficulty of making the pattern and bore of the disc concentric because the bore and pattern are in all cases made by separate operations. A lack of concentricity slows disc installation because the disc pattern must be made concentric with the axis of rotation before the disc is fixed in its final position.

Continuous substrate discs cannot always be made thick enough to satisfactorily avoid breakage because many applications do not allow the resulting high inertia.

Perforated discs have commonly presented two deficiencies: the windows often cannot be made as small as required because of the inherent ratios between material thickness and minimum window size and the flatness of a perforated disc (because of internal stress or distortion during perforation) is often inadequate. A warped disc, if it is useable at all, requires special design considerations in the light sensor and source if the signal from the sensor is not to be adversely affected.

Perforated discs made by electroplating have the additional deficiencies of being costly and delicate.

This invention solves a number of the problems which beset the prior art discs described above. The improved disc described herein, whether it be any of the foregoing types, is inherently flatter. In its most preferred form as a perforated type, its windows can be made smaller than those of all the perforated discs except those made by electroplating. It is more durable than all the emulsion coated discs, electroplated discs, and discs which are subject to breakage, such as the glass type. The bore and code track or window pattern are generated by the same process and are inherently concentric. The term "code track means" is used herein to refer generally to any code means used on an encoder disc.

BRIEF SUMMARY OF THE INVENTION

In its broadest aspects, this invention comprises a laminated encoder disc; that is, a disc made by uniting two or more superimposed layers of materials. Such a disc may incorporate any of the various code track means already in use in the prior art. In its most preferred form the invention comprises two stainless steel (such as type 304 or 316, for example) laminations or layers, one being thinner than the other. Both layers contain openings such as a mounting opening or bore and window openings or any other desired perforated pattern. Accurately sized openings are more readily formed in thinner layers than in thicker ones. Thus, in the thicker lamination larger openings than desired are formed, and in the thinner lamination more accurately sized openings are formed. The preferred method of forming such openings in the thin layer is by etching when stainless steel or other metal laminations are utilized.

DETAILED DESCRIPTION OF THE INVENTION

Figure 1:
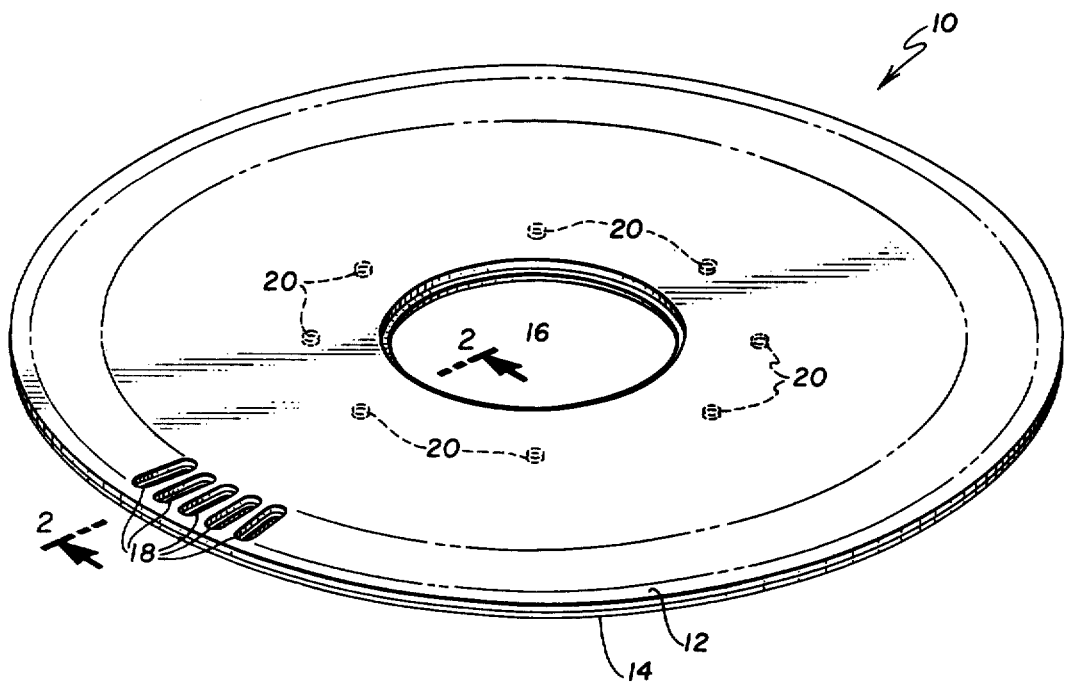
FIG. 1 is a perspective view of a stainless steel laminated encoder disc according to the invention.
Figure 2:
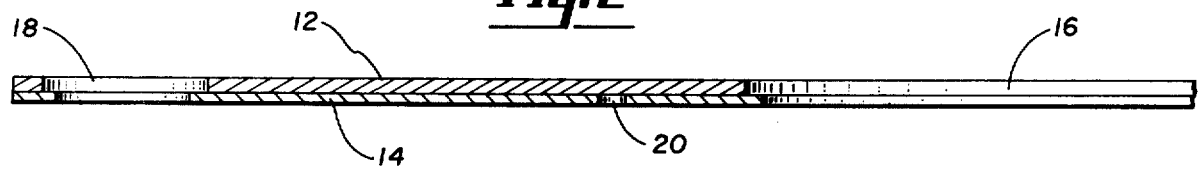
FIG. 2 is an enlarged cross-section taken along line 2—2 of FIG. 1 showing the laminations and the different sizes of the openings therein.

A preferred embodiment of the invention is described in conjunction with the drawing FIGS. 1 and 2 which show a laminated disc of stainless steel 10 which has the accuracy of a glass disc but is lower in cost and much more rugged. Disc 10 is comprised of two laminated stainless steel layers 12 and 14. Both layers 12 and 14 define a mounting opening or bore 16 and a plurality of window or slot-like openings 18 which may be distributed about the entire 360° periphery of the encoder disc in a predetermined spaced pattern or which may take the form of any required code track means. Stainless steel disc 12 is preferably about 0.004 inches thick. The openings therein are preferably etched. This disc functions as a carrier or back-up disc and provides a stiff, flat backing to which thinner stainless steel disc 14 is laminated. Disc 14 is thinner than disc 12, preferably about 0.001 inches thick. The openings therein can be most accurately formed by etching, preferably from both sides thereof. The relative shallowness of etch depth of the thinner lamination layer results in improved accuracy as to size, shape and the like of the openings therein. Concentricity between the window track arrangement or scale section of the disc and the centered mounting hole or bore is maintained by tight control over the artwork utilized for the etching treatment.

A primary benefit of the laminated arrangement of the preferred embodiment wherein one layer is thinner than the other lies in the fact that such an arrangement allows the formation of a more accurate window or slot opening 18 in the thin layer while providing flatness and rigidity by means of the thick layer, in which the openings are larger so as not to interfere with the accurate sizing of the corresponding openings in the thin layer.

Utilizing a disc made according to the most preferred embodiment, it is possible to obtain 700 lines on a 1.0 inch diameter track. Disc diameter and mounting hub diameter determine the amount of perpendicularity runout which can be achieved. However, on a 1.5 inch diameter disc one can expect about 0.003 inch total indicator reading (TIR). A 0.0005 inch TIR concentricity of track to bore can be obtained by normal manufacturing procedures.

However, flatness of the laminated disc is another improved feature of this invention. Flatness is a function of the number of layers used and the flatness of each. The greater the number of layers, the flatter will be the resulting disc, even if all layers have identical curvature. A laminated disc whose component layers have opposing curvature will be flatter still. The laminated disc is also flatter than a disc made of only one layer, unless the material for the single layer is unusually free of internal stress or initial curvature.

Flatness and rigidity in an encoder disc is desirable so that the disc can be handled and accurately connected, as to a hub (not shown) by laser welding, resistance welding, adhesive bonding, or other suitable attachment means, and subsequently mounted on a shaft driven by a DC motor or the like. The embodiment shown is intended for such a hub-mounting arrangement and includes several openings 20 in the thin layer 14 only, which make it easier to weld the thick layer 12 to a hub. Larger holes through both layers could also be provided, to permit attachment of a molded plastic hub by heat striking or ultrasonic welding.

The particular thicknesses described above i.e., 0.001 inch for thin layer 14 and 0.004 inch for thicker layer 12 represent the most preferred thickness sizes for a laminated disc of two stainless steel layers. However, when stainless steel is used, disc 12 may conveniently range from about 0.002 inch to about 0.015 inch in thickness and thin disc 14 may range conveniently from about 0.0005 inch to about 0.004 inch in thickness. The overall thickness in any particular encoder disc, the materials utilized for the layers and the individual thickness of each will depend upon the flatness, line count and inertia requirements of the particular encoder disc.

For volume production of encoder discs according to the invention, a plurality of thick discs 12 may be etched from a single sheet but not separated therefrom. It is typical to have one or more tabs securing etched parts to a work piece sheet. Similarly, a plurality of thin discs 14 may be etched from a large sheet also. With the thin and thick discs or layers remaining attached to the work piece sheets and after etching, the sheets may be superimposed relative to each other so as to register individual paired discs from each sheet and they may be laminated together and separated from the sheet workpiece thereafter.

It is preferred that discs 12 and 14 be united with a heat-cure epoxy such as EC-2290, a Minnesota Mining and Manufacturing Company epoxy. However, other adhesives such as methyl cyanoacrylate and the like or even spot welding may be utilized to unite the laminations. When an epoxy is used, it is applied to one or both surfaces to be united, following which the parts are clamped flat during curing. They are allowed to cure fully before the clamping means are removed. Any of a variety of clamping arrangements known in the art may be used for this purpose. The resultant lamination is flatter than a single, solid piece due to a "sandwich" effect.

When selecting the lamination materials to be utilized in any particular instance, consideration must be given to any differences in thermal expansion characteristics in order to avoid distortion of the encoder element. This is particularly important when one or more of the lamination layers is a metal.

Various changes may be made in the details of the invention. Thus, it is not intended to limit the invention to the specific embodiments described but rather to define the invention by the following claims.

I claim:

1. An improved encoder disc including code track means, the disc being comprised of at least two superimposed and united layers wherein one of the layers is thinner than the other and wherein the layers define a centered mounting hole, the size of the hole being more precisely defined by the thinner layer, the hole in the thicker layer being larger overall.

2. An improved encoder disc including code track means, the disc consisting of two superimposed and united stainless steel layers.

3. The encoder disc of claim 2 wherein the layers include a plurality of spaced openings positioned about the periphery thereof.

4. The encoder disc of claim 3 wherein the size of the openings are more precisely defined in the thinner layer, the openings in the thicker layer being larger overall.

5. The encoder disc of claim 1 wherein the layers are united by means of an adhesive.

6. The encoder disc of claim 5 wherein the adhesive is an epoxy.

7. The encoder disc of claim 6 wherein the epoxy is of the heat curable type.

8. An encoder disc comprised of at least two laminated layers of stainless steel.

9. The encoder disc of claim 8 wherein one of the layers is thinner than the other.

10. The encoder disc of claim 9 wherein the layers define a centrally-located circular mounting opening and a plurality of spaced peripherally-located window openings.

11. The encoder disc of claim 10 wherein the sizes of the mounting opening and the window openings are larger overall in the thick layer than in the thin layer.

12. The encoder disc of claim 10 wherein the openings are defined and located to more specific tolerances in the thin layer than in the thick layer.

13. The encoder disc of claim 8 adapted to be fitted to a shaft with a hub by means of a centrally located shaft mounting opening extending through the layers and a plurality of radially spaced hub connector openings extending through only one of the layers.

14. The encoder disc of claim 13 wherein the layer defining the hub connector openings is thinner than the other layer.

15. An encoder disc comprised of two superimposed, united layers of stainless steel.

16. The encoder disc of claim 15 wherein one layer ranges from about 0.0005 to about 0.004 inch in thickness and the other layer ranges from about 0.002 to about 0.015 inch in thickness.

17. The encoder disc of claim 16 wherein the one layer is about 0.004 inch thick and the other layer is about 0.001 inch thick.

18. A method of making an encoder disc wherein two layers of stainless steel are laminated together.

19. The method of claim 18 wherein one of the layers is thicker than the other.

20. The method of claim 19 wherein a mounting opening and a perforated code track means are formed through at least the thin layer by etching.

21. The method of claim 19 wherein the overall size of the openings is larger in the thick layer than in the thin layer.

22. The method of claim 20 wherein the openings in the thin layer are etched from both sides of the layer for more precise sizing.

23. The method of claim 18 wherein the lamination of the two layers is accomplished by means of an adhesive.

24. The method of claim 23 wherein the adhesive is a heat-cured epoxy and the layers are clamped together during curing.

* * * * *